United States Patent
Mori

(10) Patent No.: US 8,853,736 B2
(45) Date of Patent: Oct. 7, 2014

(54) SEMICONDUCTOR DEVICE AND POWER CONVERTER USING IT

(75) Inventor: Mutsuhiro Mori, Mito (JP)

(73) Assignee: Hitachi, Ltd., Tokyo (JP)

( * ) Notice: Subject to any disclaimer, the term of this patent is extended or adjusted under 35 U.S.C. 154(b) by 578 days.

(21) Appl. No.: 12/766,952

(22) Filed: Apr. 26, 2010

(65) Prior Publication Data

US 2011/0073905 A1    Mar. 31, 2011

(30) Foreign Application Priority Data

Sep. 30, 2009  (JP) ................................. 2009-225914

(51) Int. Cl.
  *H01L 27/06*  (2006.01)
  *H01L 29/739*  (2006.01)

(52) U.S. Cl.
  CPC ........ *H01L 27/0664* (2013.01); *H01L 29/7395* (2013.01); *H01L 29/7391* (2013.01)
  USPC ............. 257/140; 257/E27.017; 257/E27.031

(58) Field of Classification Search
  CPC ............ H01L 27/0629; H01L 27/0635; H01L 27/0664; H01L 27/0716; H01L 27/0727; H01L 27/0761; H01L 29/7391
  USPC ........................ 257/140, E27.017, E27.031
  See application file for complete search history.

(56) References Cited

U.S. PATENT DOCUMENTS

| | | | |
|---|---|---|---|
| 5,101,244 A | 3/1992 | Mori et al. | |
| 2003/0099120 A1* | 5/2003 | Yu | ................................... 363/50 |
| 2009/0206812 A1 | 8/2009 | Sasaya et al. | |
| 2009/0261428 A1* | 10/2009 | Chao et al. | .................... 257/409 |
| 2010/0155830 A1* | 6/2010 | Takahashi | ..................... 257/328 |

FOREIGN PATENT DOCUMENTS

| | | |
|---|---|---|
| EP | 2007-173783 | 5/2007 |
| JP | 2590284 | 12/1996 |
| JP | 09-107097 | 4/1997 |
| JP | 2000-077682 | 3/2000 |
| JP | 2006-269824 | 10/2006 |
| WO | WO 00/51167 | 8/2000 |
| WO | WO 2009031567 A1 * | 3/2009 |

OTHER PUBLICATIONS

Extended European Search Report, dated Nov. 29, 2011 [7 pages].

* cited by examiner

*Primary Examiner* — Yu Chen
(74) *Attorney, Agent, or Firm* — Antonelli, Terry, Stout & Kraus, LLP.

(57) ABSTRACT

A semiconductor device and a power converter using it wherein a switching power device and a flywheel diode are connected in series, the flywheel diode includes a region having a Schottky junction to operate as a Schottky diode and a region having a pn junction to operate as a pn diode and control operation is performed such that when current flows forwardly through the flywheel diode, the pn diode operates and when the flywheel diode recovers backwardly, the Schottky diode operates mainly.

15 Claims, 16 Drawing Sheets

SEMICONDUCTOR DEVICE AND POWER CONVERTER USING IT

BACKGROUND OF THE INVENTION

The present invention relates to a semiconductor device and a power converter using it and more particularly, to a semiconductor device of the type having flywheel diodes and a power converter using the same.

In recent years, many kinds of inverters and converters have been used in electric power converters dedicated to energy saving and renewable energy technologies. For realization of Low-carbon society, drastic spread of the power converters is still indispensable. FIG. 19 shows an example of an inverter for controlling a motor 950 in variable speed and realizing energy saving. Electric energy from a DC power supply Vcc is converted into an alternating current at a desired frequency through the use of IGBT's (Insulated Gate Bipolar Transistors) 700, that is, a kind of power semiconductors, in order to change the revolution speed of the motor 950. The motor 950 is a three-phase motor having an input 910 of U-phase, an input 911 of V-phase and an input 912 of W-phase. Input power is fed to the U-phase 910 when a gate circuit 800 for an IGBT 700a having its collector connected to a positive terminal 900 of power supply (hereinafter referred to as an upper arm IGBT) is turned on. On the other hand, by turning off the gate circuit 800, feeding of the input power to the U-phase 910 can be stopped. By repeating this operation, electric power at a desired frequency can be supplied to the motor 950.

A flywheel diode 600a is connected to the IGBT 700a in anti-parallel relation thereto. For example, with the upper arm IGBT 700a turned off, for example, the flywheel diode 600a is so operated as to commutate the current having been flowing through the IGBT 700a to a flywheel diode 600b connected to an IGBT 700b having its emitter connected to a negative terminal 901 of power supply (hereinafter referred to as a lower arm IGBT) in anti-parallel relation thereto, thus making it possible to release energy accumulated in a coil of the motor 950. As the upper arm IGBT 700a is again turned on, the lower arm flywheel diode 600b is rendered non-conductive and electric power is supplied to the motor 950 via the upper arm IGBT 700a. In this manner, the flywheel diodes 600a and 600b are rendered non-conductive and conductive reiteratively in accordance with turn on and off of the IGBT's 700a and 700b and therefore, the conduction loss in each of the flywheel diodes 600a and 600b needs to be decreased for the sake of realizing high efficiency, size reduction and cost reduction of an inverter to thereby promote the widespread use of the inverter. To this end, the forward voltage drop occurring in each of the flywheel diodes 600a and 600b when the current flows through these flywheel diodes must be reduced. In a power semiconductor having a rated voltage of several hundreds volts or more, a pn diode made of silicon to have the ability to increase the conductivity by injecting electric charges is generally used to decrease the forward voltage drop.

On the other hand, when the upper arm IGBT 700a repeats turn on and off, electric charges accumulated during forward biasing in the lower arm flywheel diode 600b are discharged to play the role of a backward recovery current which is superposed on a turn-on current of the upper arm IGBT 700a. The backward recovery current flows through a closed circuit of DC power supply Vcc, parasitic inductance 920, high voltage side terminal 900, upper arm IGBT 700a, lower arm flywheel diode 600b and low voltage side terminal 901 and during the switching, it increases the turn-on loss in the upper arm IGBT 700a and generates the backward recovery loss in the lower arm flywheel diode 600b. If having a large rate of current change (di/dt), the backward recovery current generates an excessive bounce voltage (L×di/dt) cooperatively with the parasitic inductance 920(L) and in case the bounce voltage exceeds the rated voltage of IGBT 700 or flywheel diode 600, the inverter will sometimes become troubled and faulty.

As described above, the pn diode used for each of the flywheel diodes 600a and 600b can on the one hand reduce the forward voltage to succeed in decreasing the conduction loss but on the other hand, increases the backward recovery loss, giving rise to generation of a bounce voltage. In contrast to the pn diode, a Schottky diode is available in which the amount of injected electric charges is small and the backward recovery current is very small. But for silicon diode, the forward voltage is very large and the loss increases in the inverter handling large currents. Recently, a Schottky diode using silicon carbide (SiC) in place of silicon has been noticed. However, this type of Schottky diode is disadvantageous in that its crystalline quality is bad, its fabrication process is difficult and its increase in diameter size is inferior to that using silicon, resulting in high costs leading to prevention of cost reduction of the inverter and converter, and therefore it comes into limited use.

A conventional composite flywheel diode having pn diodes and Schottky diodes both made of silicon is described in Japanese Patent No. 2590284 (corresponding to U.S. Pat. No. 5,101,244) and is now illustrated in FIG. 20 in the accompanying drawings. A semiconductor substrate 1 has a cathode electrode 2 in ohmic contact 11 to an $n^+$ layer 13 and an $n^-$ layer 14 overlying the $n^+$ layer 13 forms pn junctions 15 in association with deep p layers. The $n^-$ layer 14 cooperates with an electrode 3 to sandwich shallow p layers, forming Schotkky junctions 16. The electrode 3 makes an ohmic contact to the deep p layer and urges the deep p layer to inject electric charges (holes) from it. By coupling the pn junction and the Schottky junction by means of the electrode 3, the amount of injection of electric charges can be increased/decreased in contrast to the case of the presence of either the pn diode alone or the Schottky diode alone, so that the forward voltage can be prevented from becoming drastically large and the backward recovery current can be prevented from extremely increasing and besides the rate of change of current di/dt of backward recovery current can be reduced, thus ensuring that the tradeoff characteristic relation among the reduction in conduction loss, the reduction in switching loss and the suppression of bounce voltage can be improved.

In the diode shown in FIG. 20, however, there arise problems that further injection of electric charges to reduce the forward voltage drop degrades the backward recovery characteristics and conversely, the suppression of electric charge injection aiming at improvements in the backward recovery characteristics increases the forward voltage accompanied by an increase in loss, making it difficult for the conventional structure to further improve the characteristics of the flywheel diode.

SUMMARY OF THE INVENTION

According to this invention, it is intended that the tradeoff relation between reduction in forward voltage drop and reduction in backward recovery current the conventional flywheel diode fails to achieve can drastically be improved to decrease the flywheel diode conduction loss and switching loss at a time and besides the bounce voltage can be suppressed to a great extent by making small the current change rate di/dt of backward recovery current.

To accomplish the above object, according to a first aspect of the present invention, in a semiconductor device, a switching power device and a flywheel diode are connected in series, the flywheel diode includes a region having a Schottky junction to operate as a Schottky diode and a region having a pn junction to operate as a pn diode, and a controller is provided for performing such control that when current flows forwardly through the flywheel diode, at least the pn diode operates and when the flywheel diode recovers backwardly, the Schottky diode operates principally.

Further, according to a second aspect of the invention, in the semiconductor device, the flywheel diode has a gate and the gate of the said flywheel diode is an insulated gate.

Further, according to a third aspect of the invention, in the semiconductor device, the insulated gate of the flywheel diode is controlled such that before the insulated gate synchronizes with a gate signal for the switching power device to cause the switching power device to switch over from off to on, an operation mode in which at least the pn diode passes the current forwardly switches over to an operation mode in which the Schottky diode passes the current principally.

Further, according to a fourth aspect of the invention, in the semiconductor device, the insulated gate of the flywheel diode is controlled such that before the insulated gate synchronizes with a gate signal for the switching power device to cause the switching power device to switch over from on to off, at least the pn diode is allowed to pass the current forwardly.

Further, according to a fifth aspect of the invention, in the semiconductor device, the flywheel diode includes a semiconductor substrate having paired surfaces, a first semiconductor layer having a first conductivity type and exposed to one surface of the semiconductor substrate, second semiconductor layers each having a second conductivity type, exposed to the other surface of the semiconductor substrate and contacting the first semiconductor layer, Schottky metals each provided on the other surface of the semiconductor substrate and contacting the first semiconductor layer to form a Schottky junction, insulated gates each bridging the second semiconductor layer of second conductivity type and the Schottky metal, an anode electrode electrically connecting to each of the Schottky metals through low resistance and a cathode electrode contacting the first semiconductor layer on the one surface through low resistance.

Further, according to a sixth aspect of the invention, in the semiconductor device, a third semiconductor layer of second conductivity type having a lower impurity concentration than the second semiconductor layer is provided between the Schottky metal and the first semiconductor layer.

Further, according to a seventh aspect of the invention, in the semiconductor device, the flywheel diode includes a semiconductor substrate having paired surfaces, a first semiconductor layer having a first conductivity type and exposed to one surface of the semiconductor substrate, second semiconductor layers each having a second conductivity type, exposed to the other surface of the semiconductor substrate and contacting the first semiconductor layer, Schottky metals provided on the other surface of the semiconductor substrate and contacting the first semiconductor layer to form Schottky junctions, fourth semiconductor layers of second conductivity type contacting the first semiconductor layer and formed on both sides of the Schottky metal opposing the second semiconductor layers, insulated gates each bridging at least the forth semiconductor layer and the second semiconductor layer, an anode electrode electrically connecting to each of the Schottky metals through low resistance and a cathode electrode contacting the first semiconductor layer on the one surface through low resistance.

Further, according to an eighth aspect of the invention, in the semiconductor device, a fifth semiconductor layer of second conductivity type having a lower impurity concentration than the second semiconductor layer is provided between the Schottky metal and the first semiconductor layer.

Further, according to a ninth aspect of the invention, in the semiconductor device, by applying to the gate electrode of insulated gate a voltage negative toward the anode electrode, the Schottky electrode and the second semiconductor layer are electrically connected to each other.

Further, according to a tenth aspect of the invention, in the semiconductor device, the flywheel diode includes a semiconductor substrate having paired surfaces, a first semiconductor layer having a first conductivity type and exposed to one surface of the semiconductor substrate, second semiconductor layers each having a second conductivity type, exposed to the other surface of the semiconductor substrate and contacting the first semiconductor layer, sixth semiconductor layers each having the first conductivity type and formed in the second semiconductor layer, a section for short-circuiting electrically the sixth semiconductor layer and the second semiconductor layer, Schottky metals provided on the other surface of the semiconductor substrate and contacting the first semiconductor layer to form Schottky junctions, insulated gates each extending over the Schottky metal, the second semiconductor layer and the sixth semiconductor layer, an anode electrode electrically connected to the Schottky metals through low resistance, and a cathode electrode contacting the first semiconductor layer on the one surface through low resistance.

Further, according to an eleventh aspect of the invention, a third semiconductor layer of second conductivity type having a lower impurity concentration than the second semiconductor layer is provided between the Schottky metal and the first semiconductor layer.

Further, according to a twelfth aspect of the invention, in the semiconductor device, the flywheel diode includes a semiconductor substrate having paired surfaces, a first semiconductor layer having a first conductivity type and exposed to one surface of the semiconductor substrate, second semiconductor layers having a second conductivity type, exposed to the other surface of the semiconductor substrate and contacting the first semiconductor layer, a sixth semiconductor layer having the first conductivity type and formed in the second semiconductor layer, a section for short-circuiting electrically the sixth semiconductor layer and the second semiconductor layer, Schottky metals provided on the other surface of the semiconductor substrate and contacting the first semiconductor layer to form Schottky junctions, a third semiconductor layer of second conductivity type provided between the Schottky metal and the first semiconductor layer and having a lower impurity concentration than the second semiconductor layer, a seventh semiconductor layer of first conductivity type formed between the third semiconductor layer and the Schottky metal, insulated gates each extending over at least the seventh semiconductor layer, the third semiconductor layer, the first semiconductor layer, the second semiconductor layer and the sixth semiconductor layer on the other surface, an anode electrode electrically connected to the Schottky metals through low resistance and a cathode electrode contacting the first semiconductor layer on the one surface through low resistance.

Further, according to a thirteenth aspect of the invention, in the semiconductor device, the third semiconductor layer makes contact to the second semiconductor layer.

Further, according to a fourteenth aspect of the invention, in the semiconductor device, by applying to the gate electrode of insulated gate a voltage positive in relation to the anode electrode, the Schottky electrode and the second semiconductor layer are electrically connected to each other.

Further, according to a fifteenth aspect of the invention, in the semiconductor device, any of the semiconductor layers has a smaller band gap than that of the other semiconductor layers.

Further, according to a sixteenth aspect of the invention, in a power converter, the switching power device is an IGBT (Insulated Gate Bipolar Transistor).

According to the present invention, by providing the flywheel diode with a novel device which switches over from the pn diode to the Schottky diode or vice-versa, current can be passed through the pn diode of small forward voltage when the current flows forwardly and backward recovery can be performed during backward recovery through the Schottky diode of small backward recovery current, with the result that the forward voltage of the flywheel diode can be reduced and the backward recovery loss can be decreased and therefore, a semiconductor device of drastically small loss and a power converter using it can be provided. Then, since the backward recovery current can be reduced and its current change rate di/dt can be rendered very small, a semiconductor device in which bounce voltage generated cooperatively with a parasitic inductance can also be decreased to a great extent and a power converter using it can be provided.

Other objects, features and advantages of the invention will become apparent from the following description of the embodiments of the invention taken in conjunction with the accompanying drawings.

DESCRIPTION OF THE EMBODIMENTS

Embodiments of the present invention will now be described with reference to the accompanying drawings.

Figure 1:
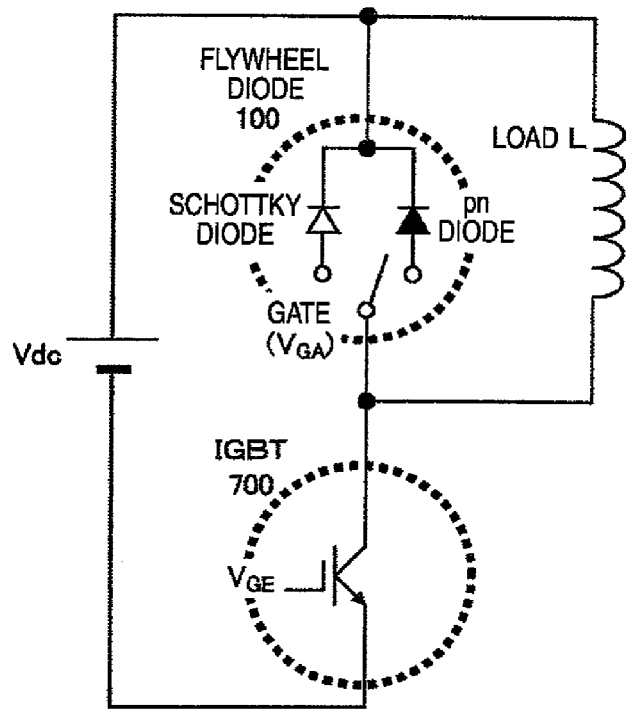
FIG. 1 is a circuit diagram showing the construction of an embodiment of a power converter according to the present invention.

Referring first to FIG. 1, an example of a semiconductor device to which the present invention is applied and a power converter using the same is illustrated in schematic circuit diagram form. In connection with FIG. 1, the power converter will be described as having paired upper and lower arms. Advantageously, in the present invention, a flywheel diode 100 is functionally separated to act as either a pn diode or a Schottky diode and has a gate for selection of the separate functions. This kind of diode will be termed hereunder a gate controlled diode. The gate controlled diode 100 can operate as the pn diode during conduction and can impersonate the Schottky diode during backward recovery, making full use of advantages of the both types, so that reduction in conduction loss and backward recovery loss and suppression of bounce voltage as well can be realized and drastic lowering of loss and of noise can be accomplished at a time.

Figure 2:
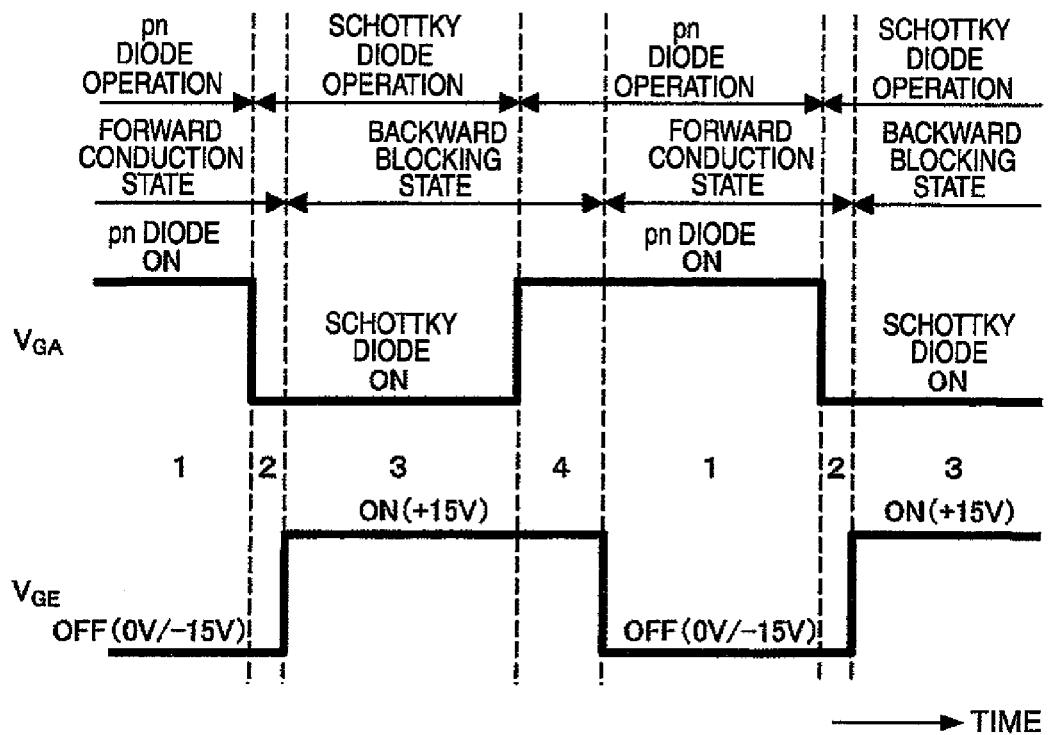
FIG. 2 is a time chart showing a preferable drive sequence in the embodiment of the power converter.

Turning to FIG. 2, the drive sequence for the gate of gate controlled diode 100 is illustrated together with gate waveforms of an IGBT 700. In this operation, the gate of IGBT 700 remains off at least immediately before the IGBT is turned on and the gate of gate controlled diode 100 is switched to cause the conduction state to switch over from the pn diode to the Schottky diode, thus preparing for backward recovery. Since the Schottky diode has already been rendered conductive when the gate of IGBT 700 is turned on, the amount of accumulated electric charges is far smaller than that for the pn diode and as a result, the backward recovery current can be reduced drastically. Next, immediately before the IGBT 700 is turned off, the gate of gate controlled diode 100 switches over from the Schottky diode to the pn diode, thus preparing for reduction of forward voltage during conduction. After turn-on, the pn diode is rendered conductive and then the conduction switches over from the pn diode to the Schottky diode immediately before the IGBT 700 is again turned on. By repeating the above operation, it is possible to make full use of advantages of the pn diode and Schottky diode and reduction in conduction loss and backward recovery loss and suppression of bounce voltage as well can be realized, thereby remarkably lowering the loss and the noise simultaneously.

Figure 19:
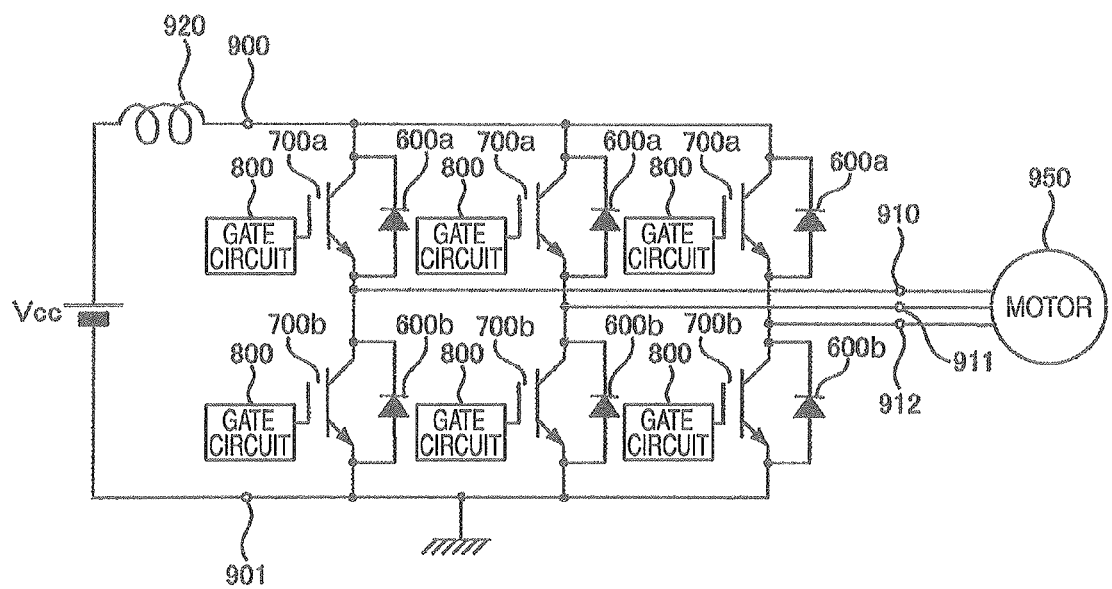
FIG. 19 is a circuit diagram showing an example of the power converter.

In order to drive the gate controlled diode 100 and the IGBT 700, a gate drive circuit (not shown) may be provided. The gate drive circuit can be made by modifying a hardware circuit and/or software program of a micro processor in the gate circuit 800 shown in FIG. 19. The gate drive circuit generates a gate control signal $V_{GA}$ supplied to the gate controlled diode 100 to switching over the gate from the pn diode to the Schottky diode and a gate control signal $V_{GE}$ supplied to the gate of IGBT 700.

Figure 3:
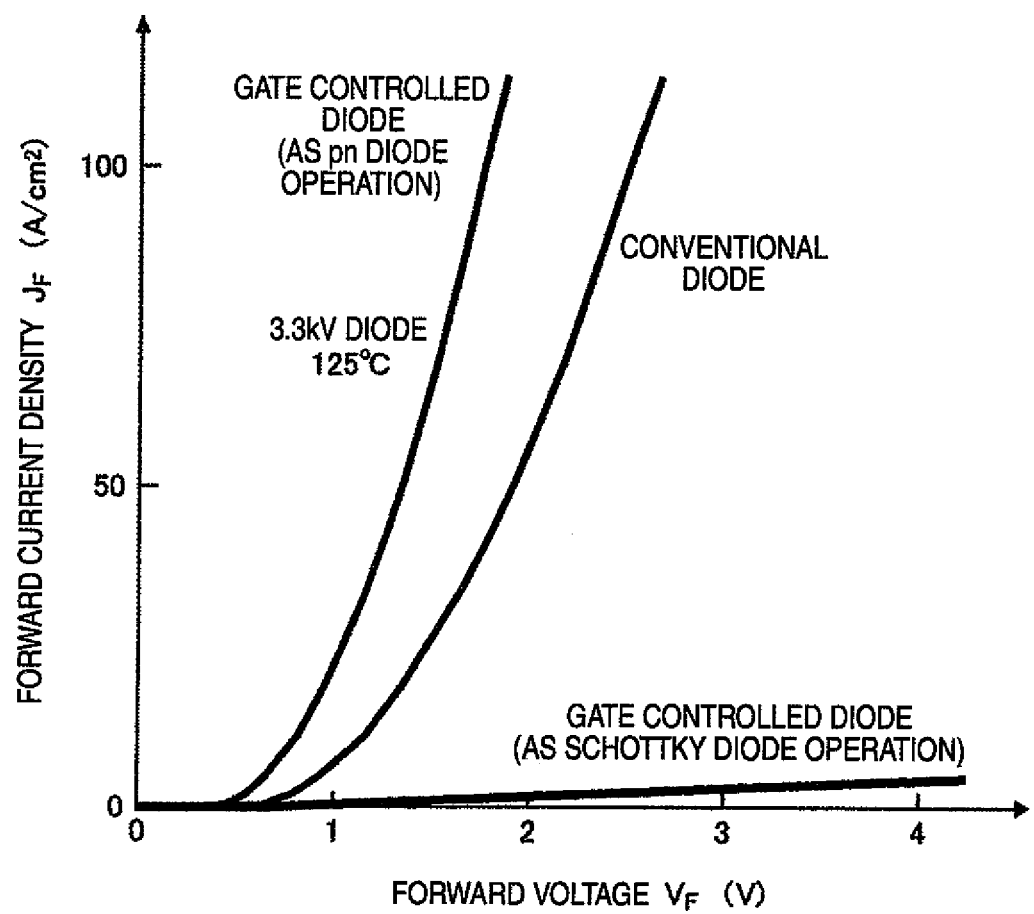
FIG. 3 is a graph showing forward characteristics of an embodiment of a semiconductor device according to the present invention and those of a conventional diode.
Figure 4:
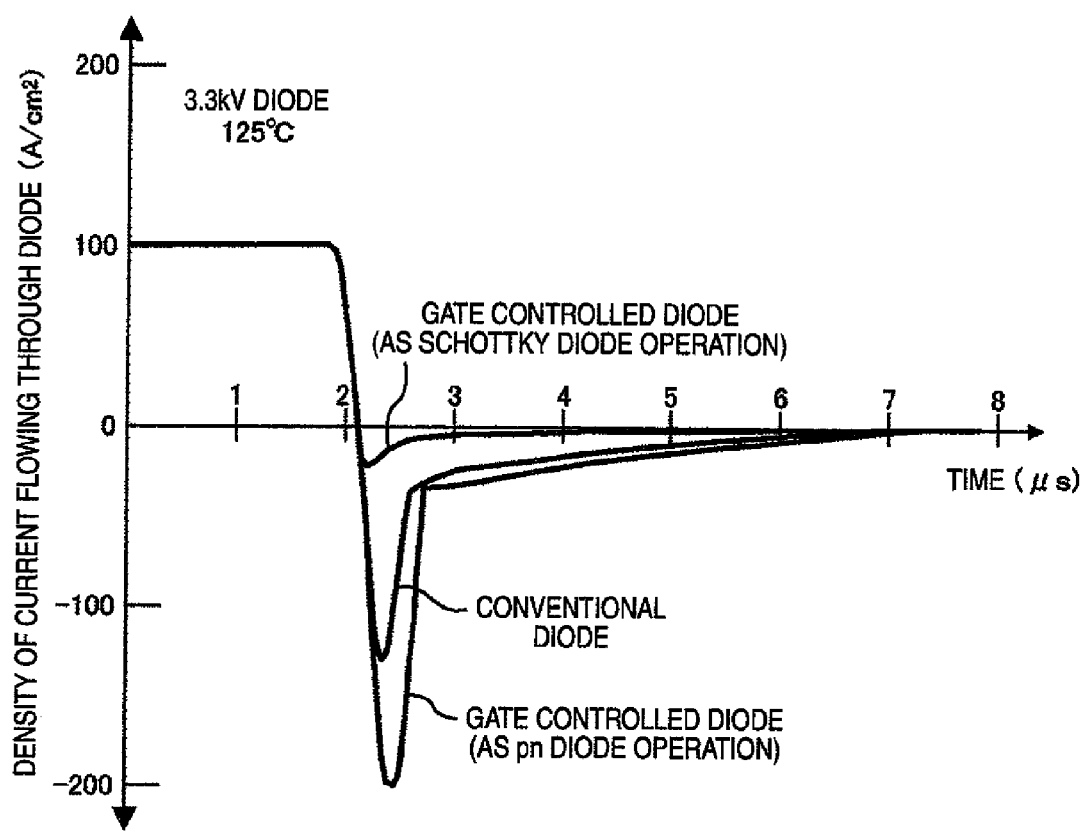
FIG. 4 is a graph showing backward recovery characteristics of the embodiment of the semiconductor device and those of the conventional diode.

These beneficial effects will be demonstrated by way of example of a diode having a rated voltage of 3.3 kV by making reference to forward characteristics as shown in FIG. 3 and backward recovery characteristics as shown in FIG. 4. It will be seen that in the case of the conventional diode 1 shown in FIG. 20, the forward voltage is larger as shown in FIG. 3 than that of the gate controlled diode 100 at the time of operation of the pn diode, resulting in a large conduction loss. On the other hand, in the backward recovery characteristics shown in FIG. 4, the gate controlled diode 100 has a far smaller backward recovery current during Schottky diode operation than that of the conventional diode and besides, the rate of current change di/dt occurring in the course of attenuation of the backward recovery current after reaching its peak is also extremely small. From these points, it will be seen that both the reduction in conduction loss and backward recovery loss and the suppression of bounce voltage can be realized at a time.

Figure 5:
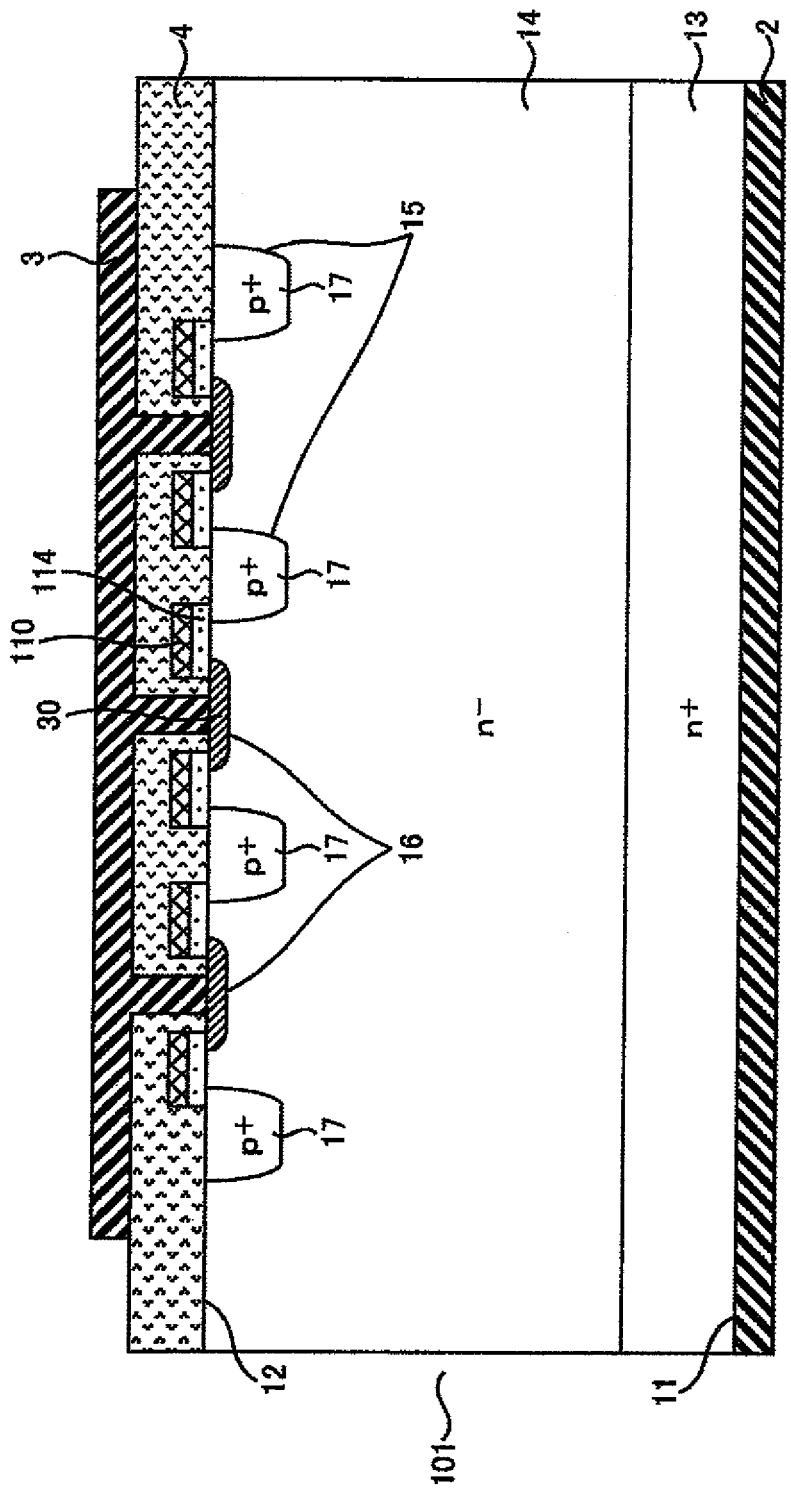
FIG. 5 is a sectional diagram showing the structure of an embodiment of the semiconductor device according to the invention.

Reference will now be made to FIG. 5 showing a cross-sectional view of an embodiment of a semiconductor device preferable to the power converter shown in FIG. 1. A semiconductor substrate 101 is constructed of an $n^+$ layer 13, an $n^-$ layer 14 and a plurality of $p^+$ layers 17 and a pn junction 15 is formed between the $p^+$ layer 17 and the $n^-$ layer 14. A Schottky electrode 30 intervenes between adjacent $p^+$ layers 17 and cooperates with the $n^-$ layer 14 to form a Schottky junction 16. Formed on one surface 11 to which the $n^+$ layer is exposed is a cathode electrode 12 and the cathode electrode 12 makes low ohmic contact to the $n^+$ layer 13. Formed on another surface 12 are insulated gates each including a gate insulation film 114 and a gate electrode 110 to bridge the Schottky electrode 30 and the $p^+$ layer 17. Then, an anode electrode 3 is formed making low ohmic contact to the Schottky electrodes 30 and isolating itself from the gate electrodes 110 with the help of an insulation film 4. To add, the $p^+$ layers 17 are illustrated as being discrete in sectional diagram of FIG. 5 but they may be coupled together at, for example, the periphery of a chip.

Figure 6:
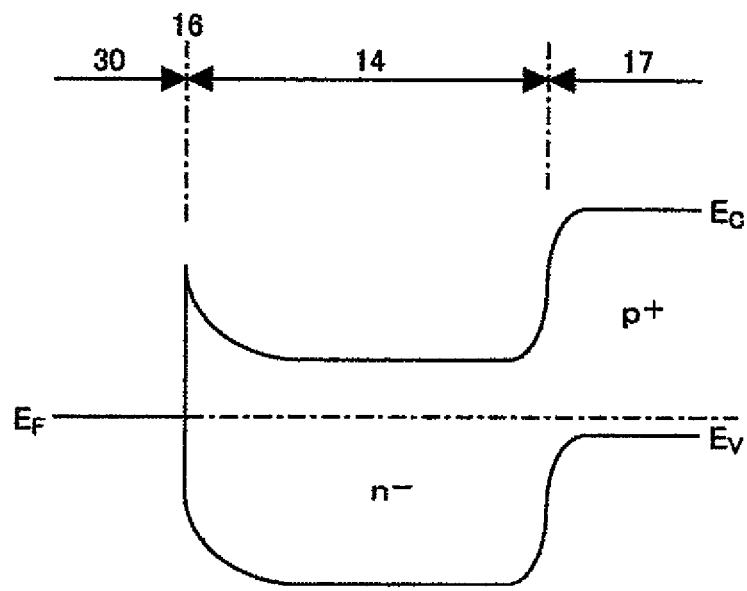
FIG. 6 is a graphic representation showing an energy band in a semiconductor layer beneath an insulated gate in the embodiment of the semiconductor device.
Figure 7:
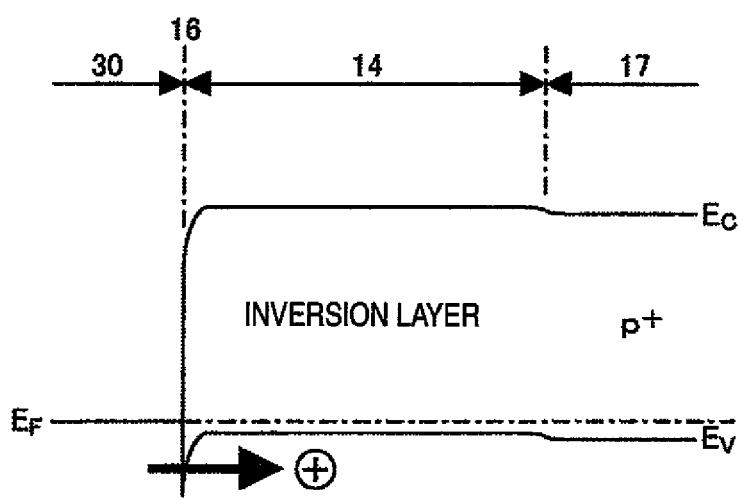
FIG. 7 is a graphic representation showing an energy band when a negative voltage is applied to the gate electrode in the FIG. 6 characteristics.

Next, the principle of operation in the present embodiment will be described with reference to FIGS. 6 and 7 and the drive sequence will be explained with reference to FIG. 8. Illustrated in FIG. 6 is a band diagram showing a thermal equilibrium state in which no electric potential is applied to the gate electrode 110. The $p^+$ layer 17 and the Schottky electrode 30 are electrically isolated from each other by means of the pn junction 15 between $p^+$ layer 17 and $n^-$ layer 14 and the Schottky junction 16 as well between Schottky electrode 30 and $n^-$ layer 14. When under this condition minus potential is applied to the gate electrode 110, there occurs a band as shown in the band diagram of FIG. 6. As will be seen, the surface of the $n^-$ layer 14 immediately beneath the gate insulation film 114 undergoes p inversion. Holes from the Schottky electrode 30 flow in the form of a tunnel current into the inversion layer, electrically short-circuiting the $p^+$ layer 17 and the Schottky electrode 30. With the gate controlled diode in FIG. 5 forwardly conditioned, a current flows from the Schottky electrode to the $p^+$ layer 17 via the inversion layer and holes from the $p^+$ layer 17 are injected to the $n^-$ layer 14, promoting the conductivity modulation in the $n^-$ layer. As a result, the forward voltage drop in the semiconductor substrate 101 decreases drastically and the conduction loss is decreased remarkably. On the other hand, with the potential on the gate electrode 110 removed, the inversion layer is extinguished and the current from the Schottky electrode 30 to the $p^+$ layer 17 is interrupted. The injection of holes from the $p^+$ layer 30 disappears and accumulated electric charges decrease. When the semiconductor substrate 101 recovers backwardly under this condition, the backward recovery current becomes very small and besides, as shown in FIG. 4, compatibility of the reduction in backward recovery loss with the reduction in current change rate di/dt can be set up.

Figure 8:
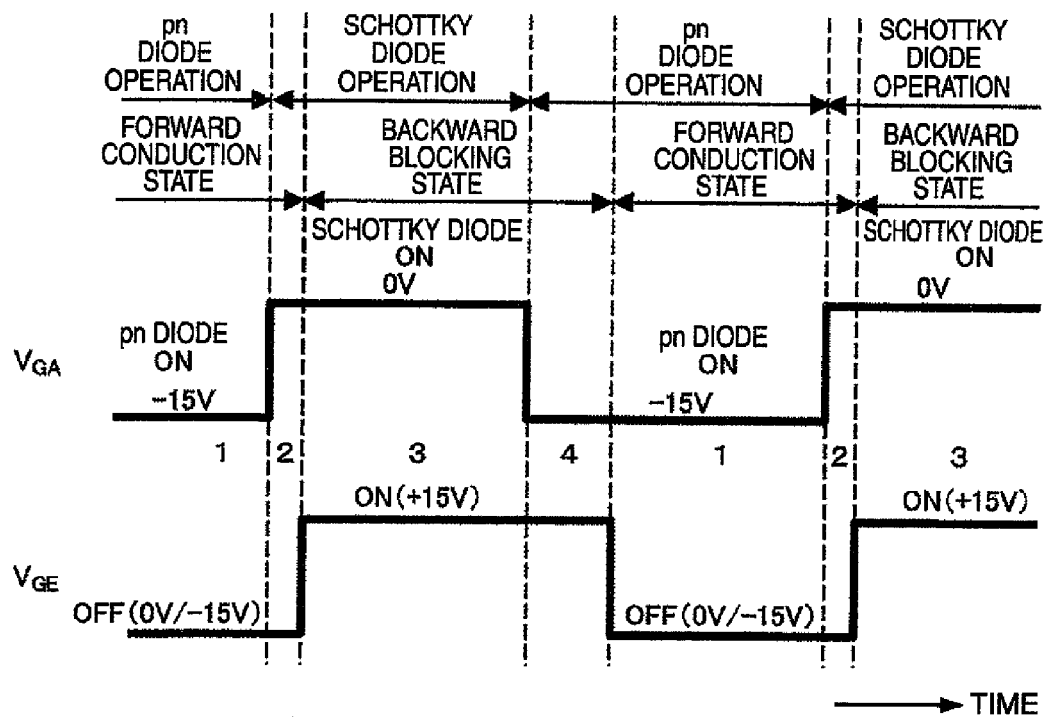
FIG. 8 is a time chart showing another drive sequence in the embodiment of the power converter.

In order to realize the operation as above, the device will preferably be operated according to the drive sequence as shown in FIG. 8. When the gate controlled diode is in forward conduction condition, minus potential is applied to the gate electrode 110 of gate controlled diode to enable the pn junction 15 to operate. Immediately before the IGBT is turned on, the gate potential on the gate controlled diode is removed to extinguish the inversion layer and to switch over to the mode of Schottky diode, realizing low loss and low noise during backward recovery. When the IGBT is turned on and the gate controlled diode is brought into backward blocking condition, voltage is interrupted by at least the Schottky diode and on the midway, minus potential is applied to the gate electrode 110 of gate controlled diode, thus preparing for the forward bias of the gate controlled diode during coming turn-off of the IGBT. In this manner, smooth shift to forward condition of the pn junction 15 of gate controlled diode can be achieved.

Figure 9:
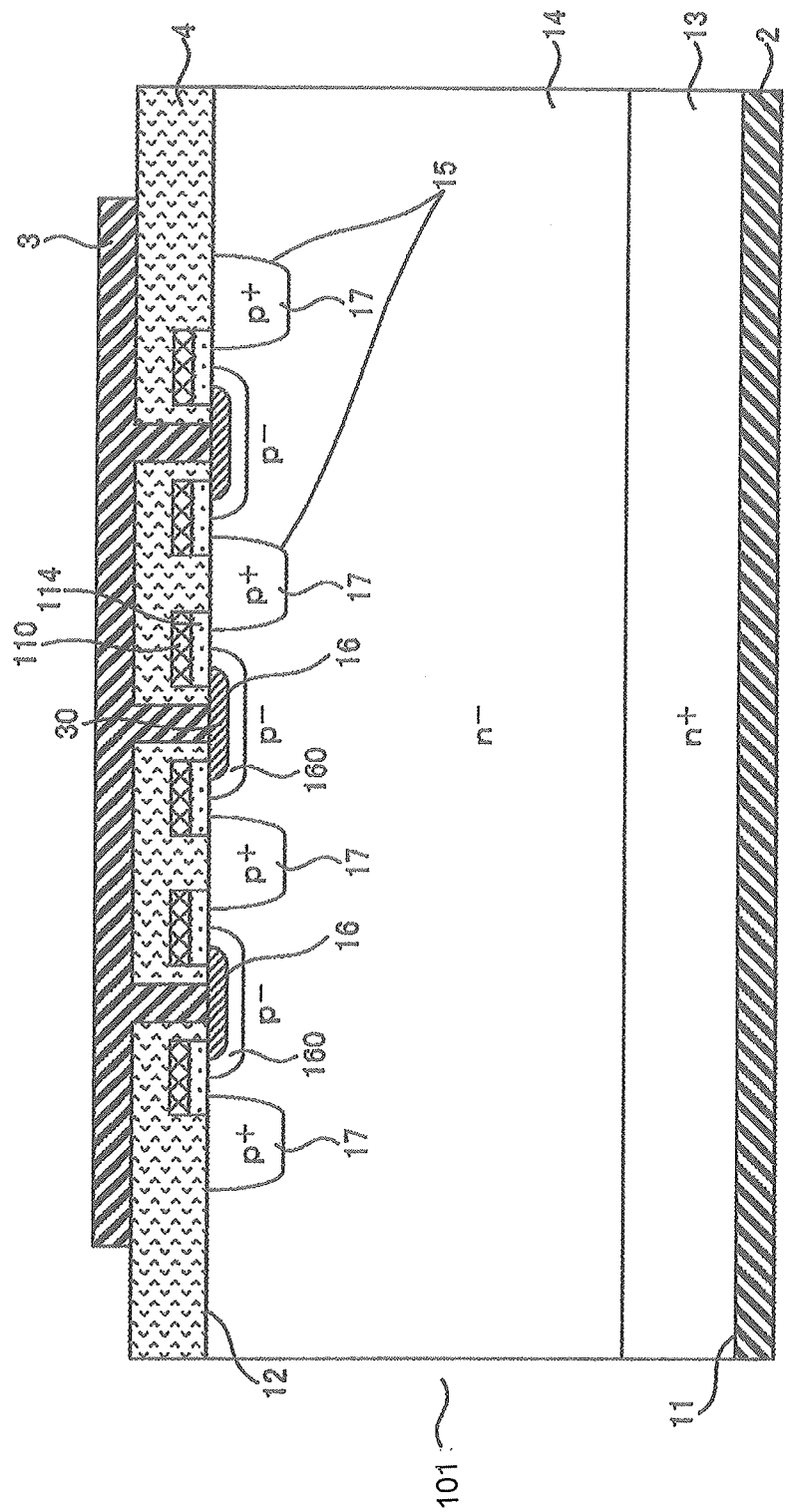
FIG. 9 is a sectional diagram showing another embodiment of the semiconductor device according to the invention.
Figure 20:
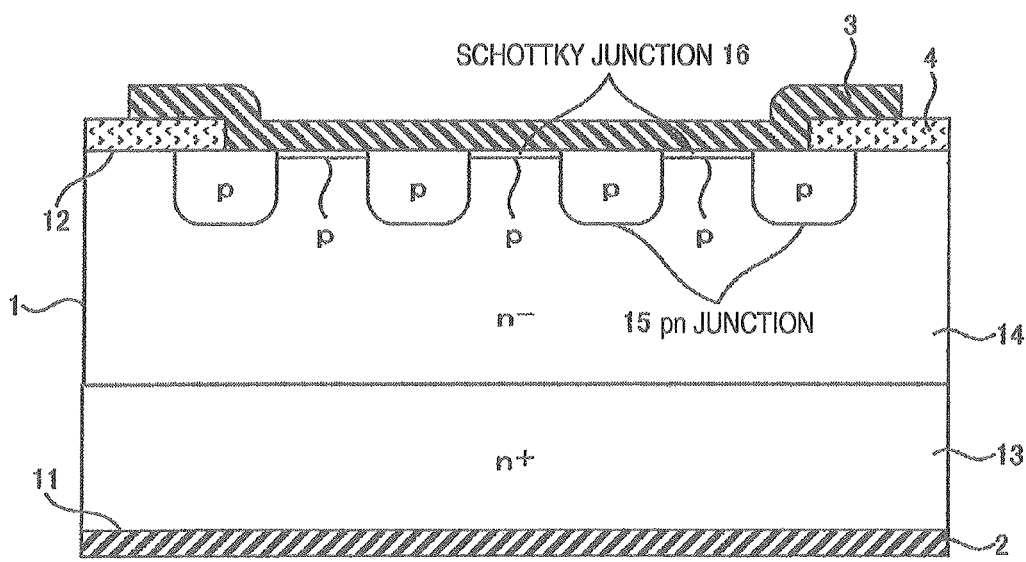
FIG. 20 is a sectional diagram showing the conventional semiconductor device.

Turning to FIG. 9, another embodiment of the invention will be described in which a $p^-$ layer 160 having a lower concentration than the $p^+$ layer substitutes for part of the $n^-$ layer 14 which is in intimate contact to the Schottky junction 16 in FIG. 5, resembling the shallow p layer in FIG. 20. Preferably, the $p^-$ layer 160 has a sheet carrier concentration of $5\times10^{12}/cm^2$ or less. With this structure, the $p^-$ layer 160 is added with diffusion potential in association with the $n^-$ layer 14 and becomes easy to deplete, so that the width of Schottky barrier can be increased to prevent leakage current at the Schottky junction from increasing. Also, when minus potential is applied to the gate electrode 110, the portion of $p^-$ layer 160 can become a $p^+$ layer having a higher concentration than that obtained in the case of inversion of the $n^-$ layer 14, thus facilitating the current flow through the Schottky junction 16 and so, additionally increasing the supply of current to the $p^+$ layer 17. As a result, the forward current increases and the forward voltage decreases.

Figure 10:
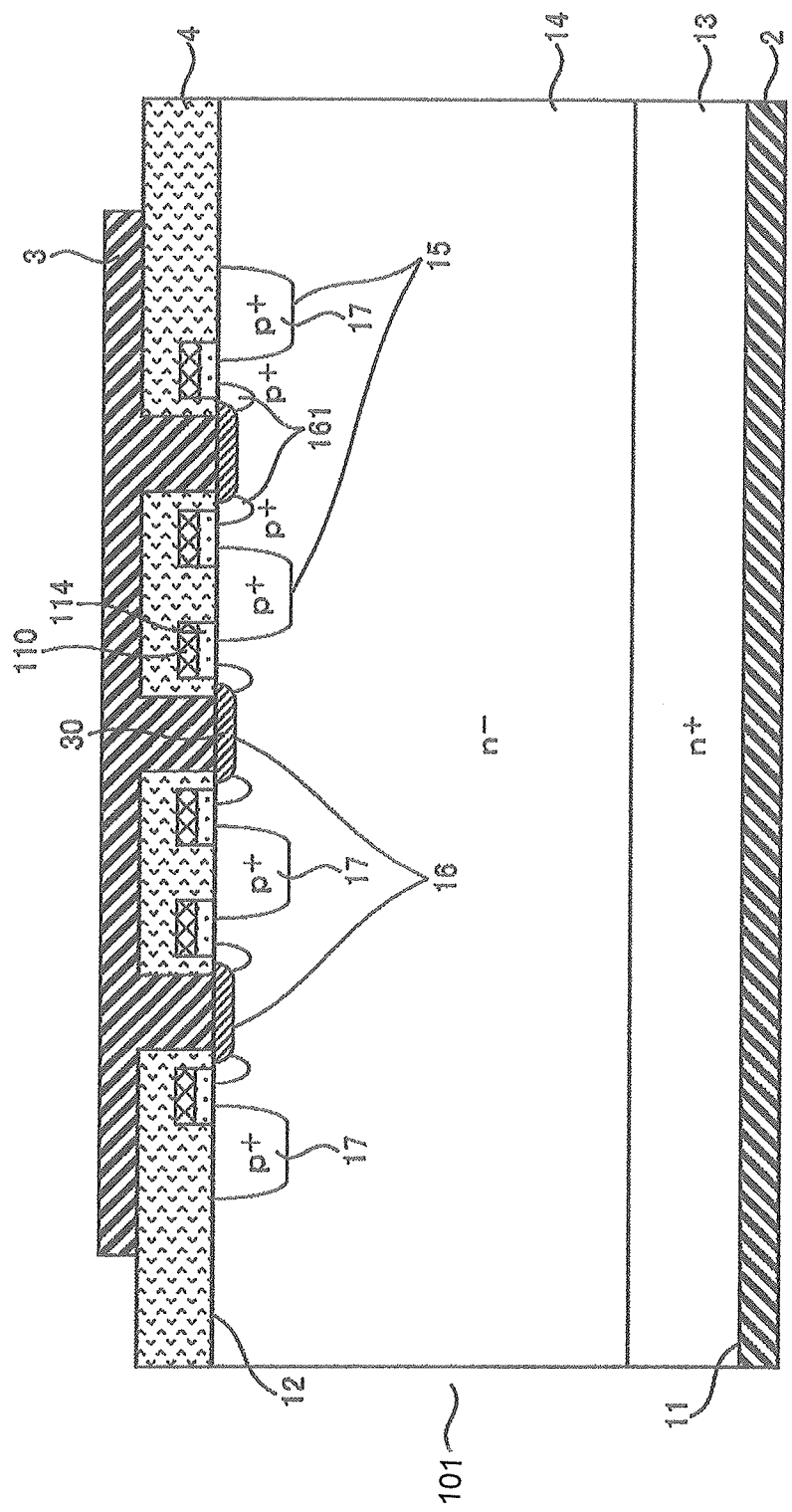
FIG. 10 is a sectional diagram showing still another embodiment of the semiconductor device.

Illustrated in FIG. 10 is still another embodiment of the invention in which $p^+$ layers 161 are provided at both ends of the Schotkky electrode 30. The $p^+$ layers 161 are formed with a view to permitting the current passing through the Schottky junction 16 between the Schottky electrode 30 in FIG. 5 and p inversion layer to flow by way of far lower resistance. With this structure, when minus potential is applied to the gate electrode 110, short-circuiting of the Schottky electrode 30 and $p^+$ layer 17 can be achieved more steadily through low resistance. Consequently, the forward voltage can be decreased.

Figure 11:
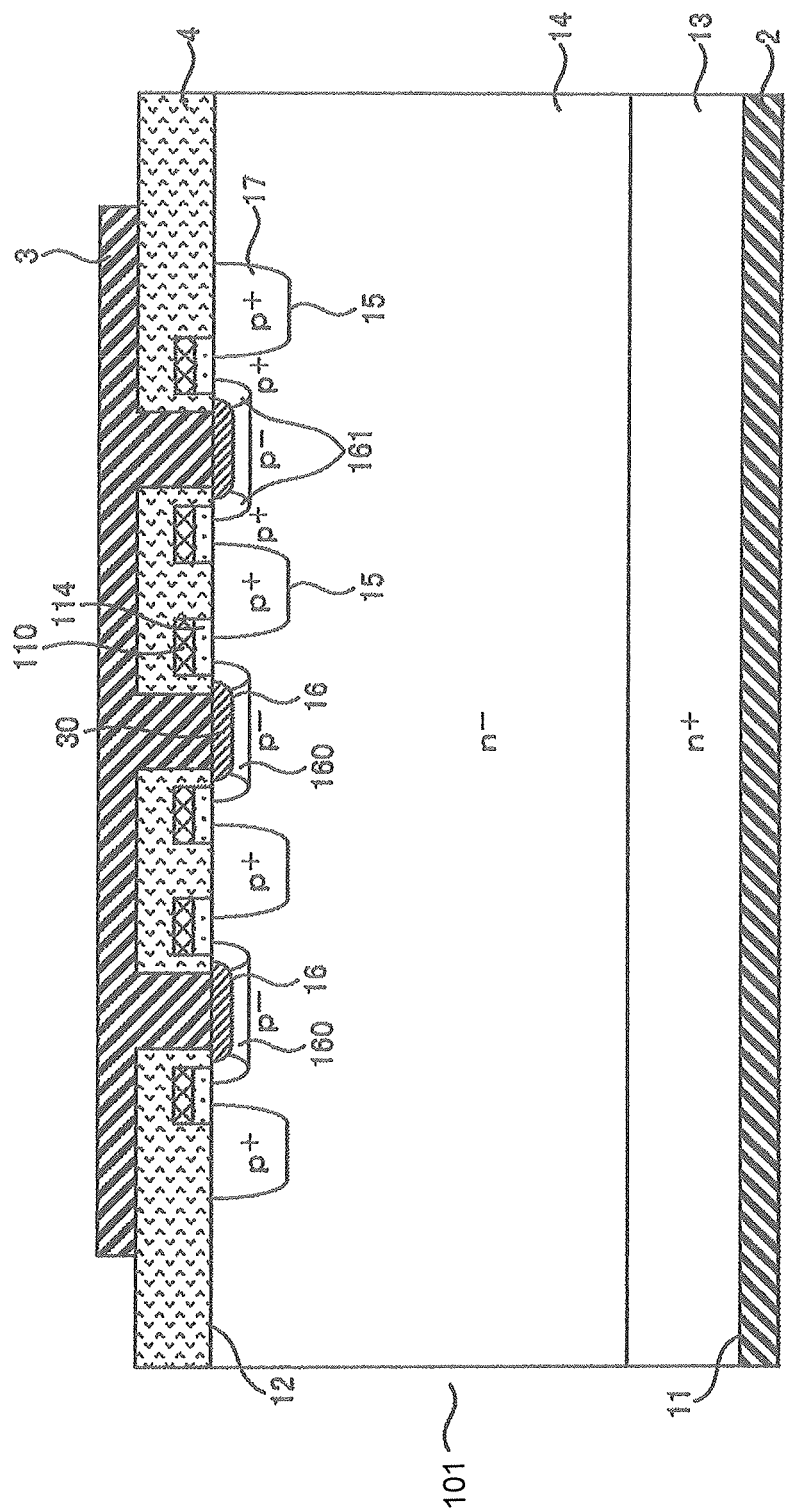
FIG. 11 a sectional diagram showing yet still another embodiment of the semiconductor device.

Illustrated in FIG. 11 is still another embodiment corresponding to a combination of the FIGS. 9 and 10 structures. A $p^-$ layer 160 decreases a leakage current in the backward blocking condition of the Schottky junction 16 and $p^+$ layers 161 can steadily realize the short-circuiting of Schottky electrode 30 and the p inversion layer of $p^+$ layer 17 through low resistance.

Figure 12:
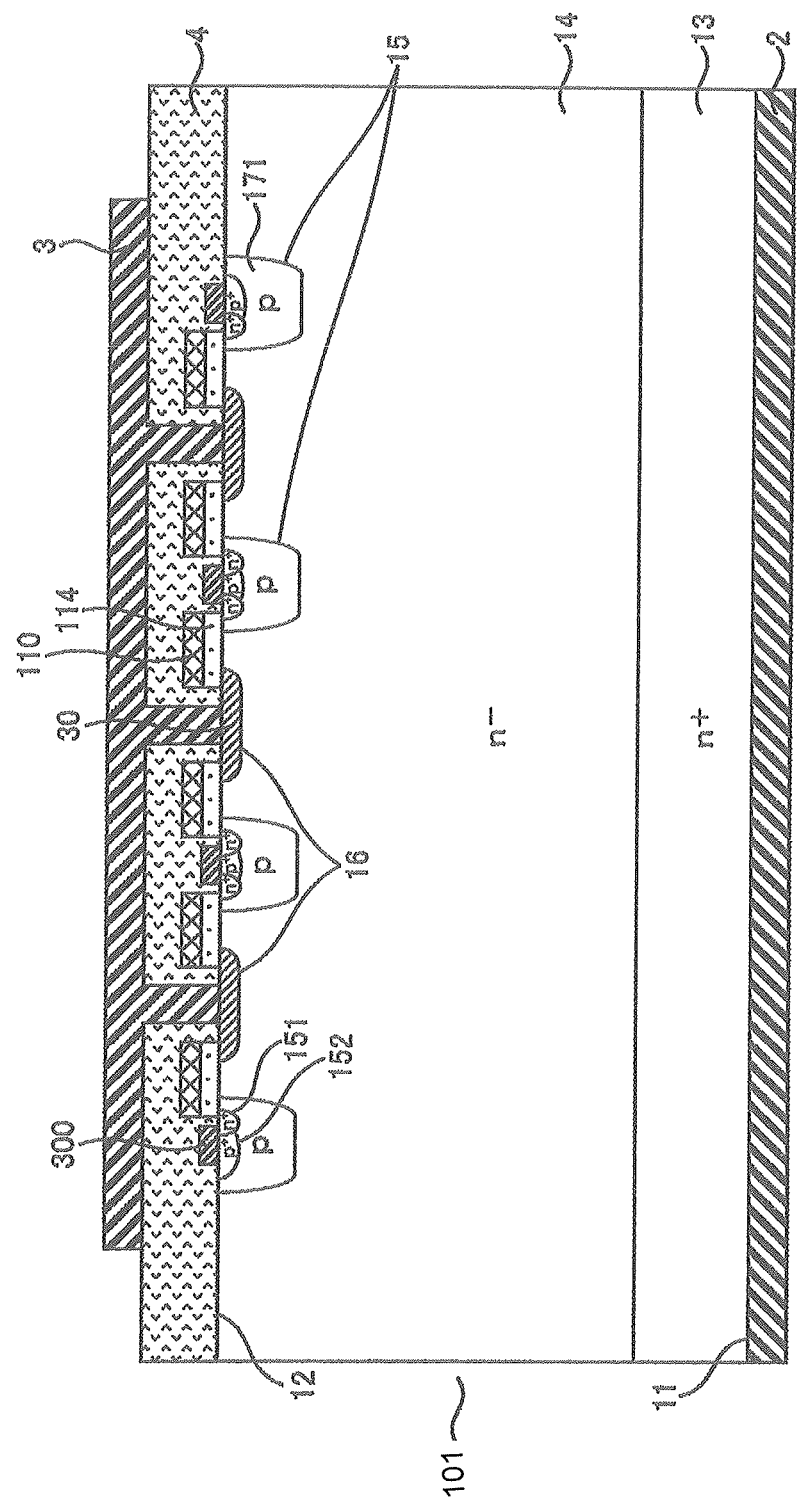
FIG. 12 is a sectional diagram showing a modified embodiment of the semiconductor device.

In the embodiments ranging to that of FIG. 11, the p inversion layer has been used as a device for switching over from the Schottky electrode to the $p^-$ layer or vice-versa but in a modified embodiment of the invention as shown in FIG. 12, n inversion layers are used. An $n^+$ layer 151 is so provided for the end of a p⁺ layer 152 as to confront the gate electrode and the insulated gate 110 is so formed as to bridge the n⁺ layer 151 and the Schottky electrode 30. The p layer 171 and the n⁺ layer 151 are short-circuited by an electrode 300 through the p⁺ layer 152. When plus potential is applied on the insulated gate 110, the p layer 171 in contact with the gate insulation film 114 undergoes n inversion and the n⁻ layer 14 undergoes n accumulation, enabling the Schottky electrode 30 and the p layer 171 to short-circuit via low resistance. In this manner, a pn diode including the p layer 171, p⁻ layer 14 and n⁺ layer 13 is formed, realizing low forward voltage during forward conduction.

Figure 13:
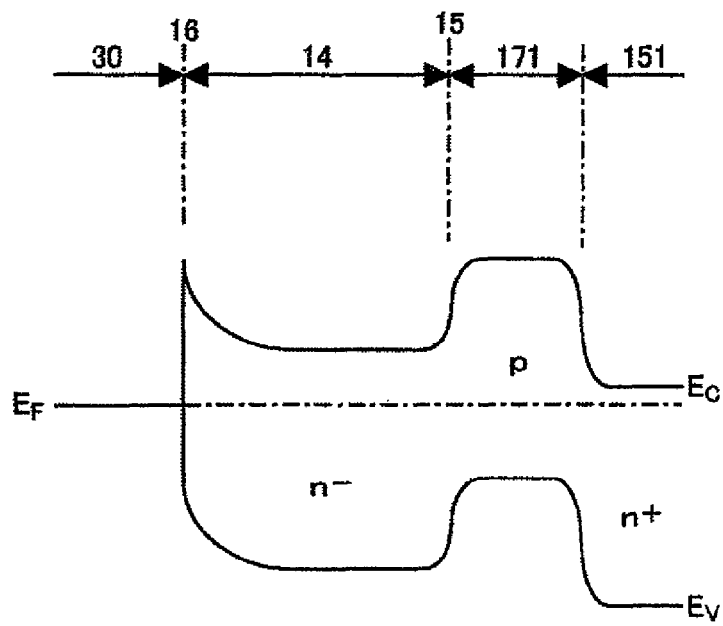
FIG. 13 is a graphical representation showing another energy band in the semiconductor layer beneath the insulated gate according to the invention.
Figure 14:
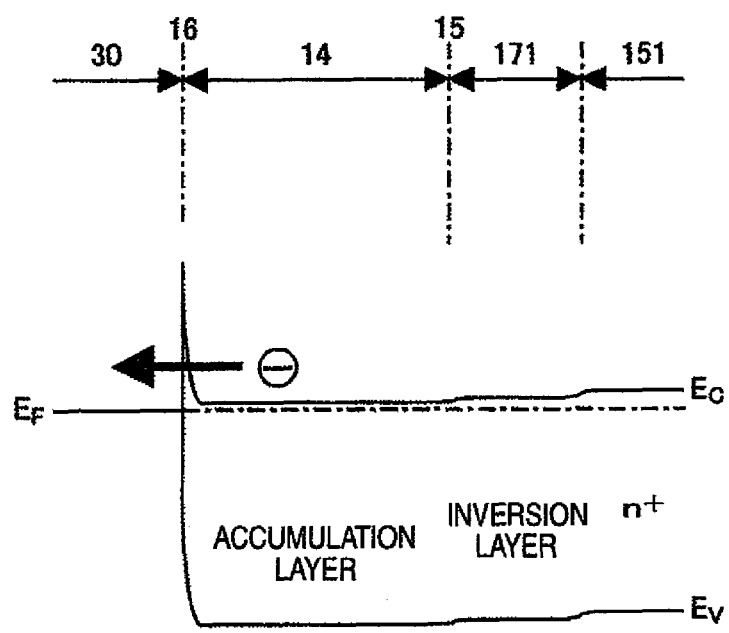
FIG. 14 is a graphical representation showing an energy band when a positive voltage is applied to the gate electrode in the case of FIG. 13.
Figure 15:
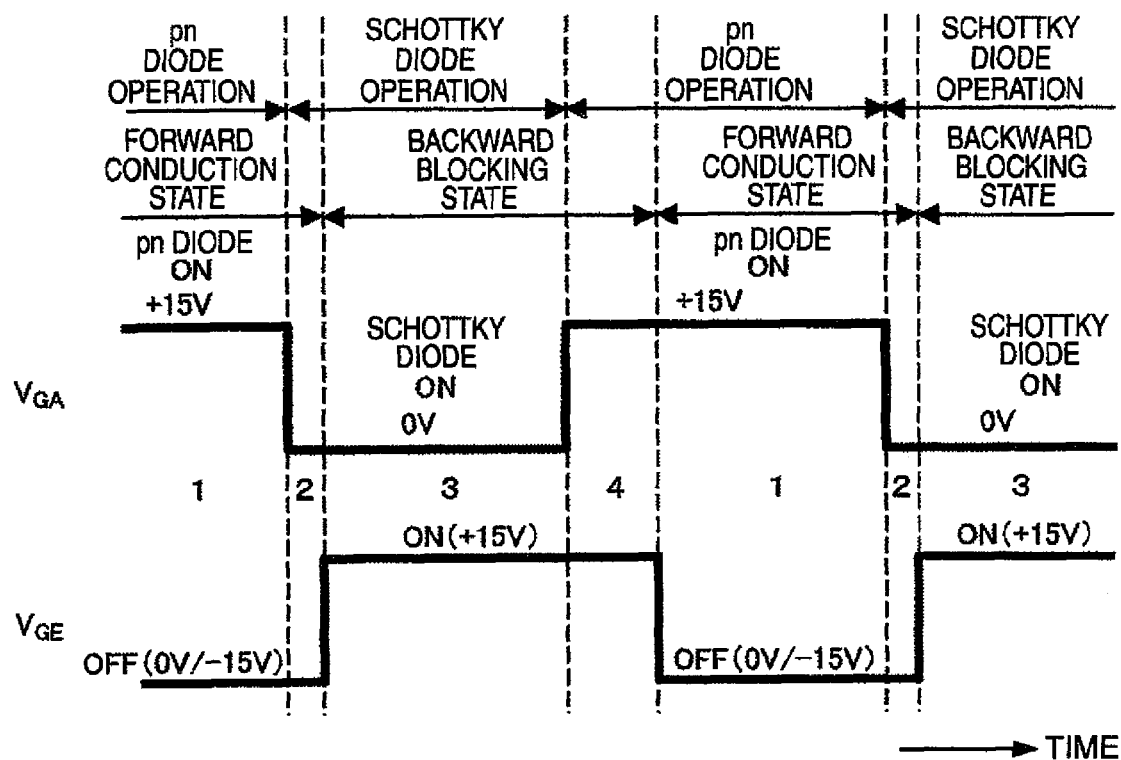
FIG. 15 is a time chart showing still another drive sequence in the power converter according to the invention.

A band diagram at the surface 12 beneath the gate electrode 110 in FIG. 12 is illustrated in FIGS. 13 and 14. FIG. 13 shows a thermal equilibrium state in the absence of potential applied to the gate electrode 110. FIG. 14 shows a state when plus potential is applied onto the gate electrode 110. An n accumulation layer is formed in the n⁻ layer 14 and an n inversion layer is formed in the p layer 171, so that electrons (indicated by (–)) pass through the Schottky barrier to enable the Schottky electrode 30 and the p layer 171 to be short-circuited. The switch-over function from Schottky junction to pn junction or vice-versa and the effects of lowering the loss and noise during the switch-over are the same as those in the embodiments ranging to that of FIG. 11 but as the Schottky electrode 30 and the p layer 171 can be short-circuited by means of the n channel layer, connection through lower resistance than in the embodiments of p channel layer ranging to that of FIG. 11 can be achieved. Its drive sequence is shown in FIG. 15. Since the switch-over can be accomplished by applying plus potential, a power supply can meritoriously be used in common to substitute for both the power supply for the gate circuit of gate controlled diode and the power supply for the gate circuit of IGBT.

Figure 16:
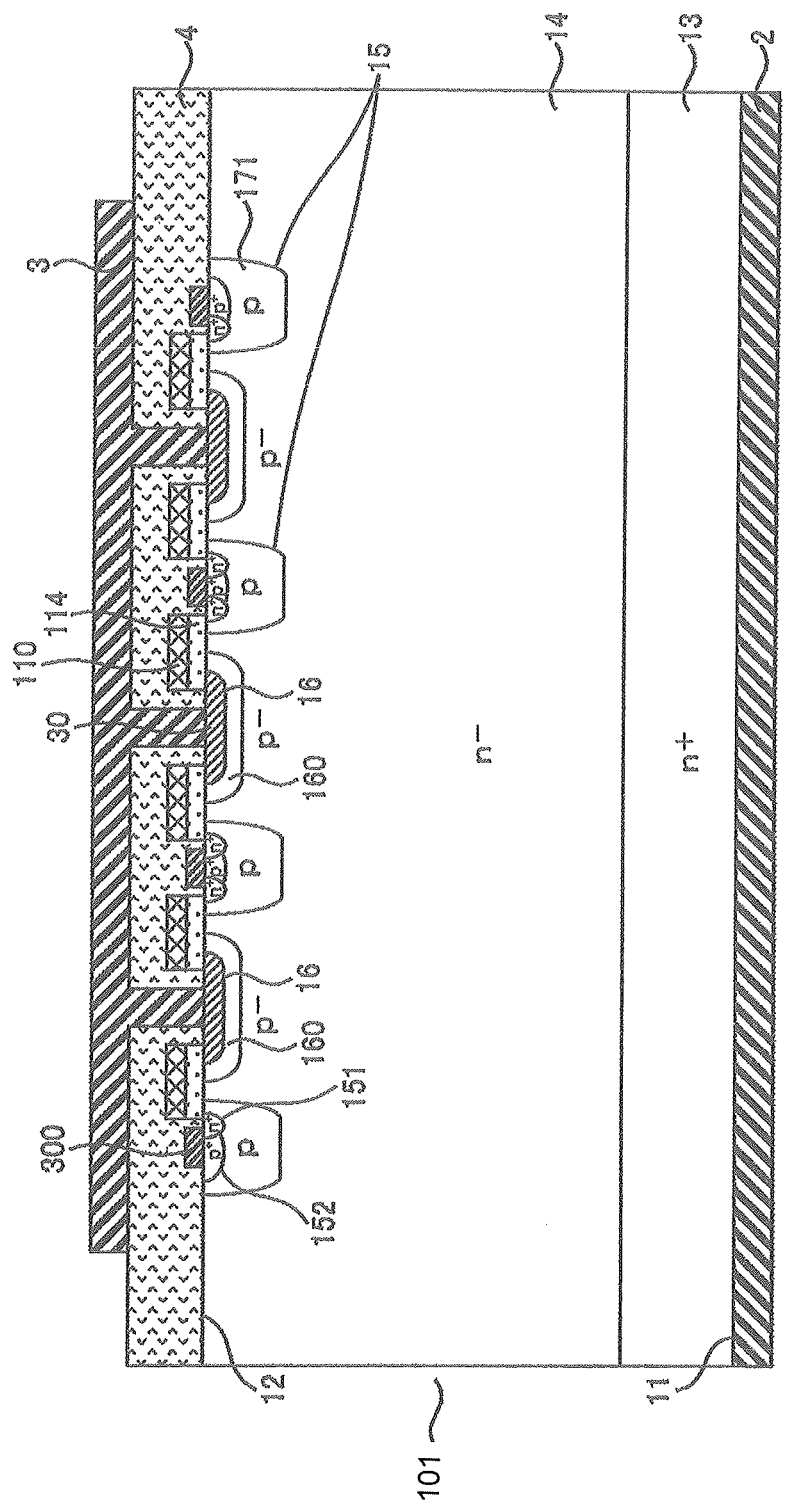
FIG. 16 is a sectional diagram showing another modified embodiment of the semiconductor device.

Referring now to FIG. 16, another modification of the embodiment of the invention in which the p⁻ layer 160 is provided as shown in FIG. 9 around the Schottky electrode in FIG. 12 will be described. By providing the p⁻ layer 160, the leakage current under the backward blocking state in the Schottky junction 16 can be prevented from increasing.

Figure 17:
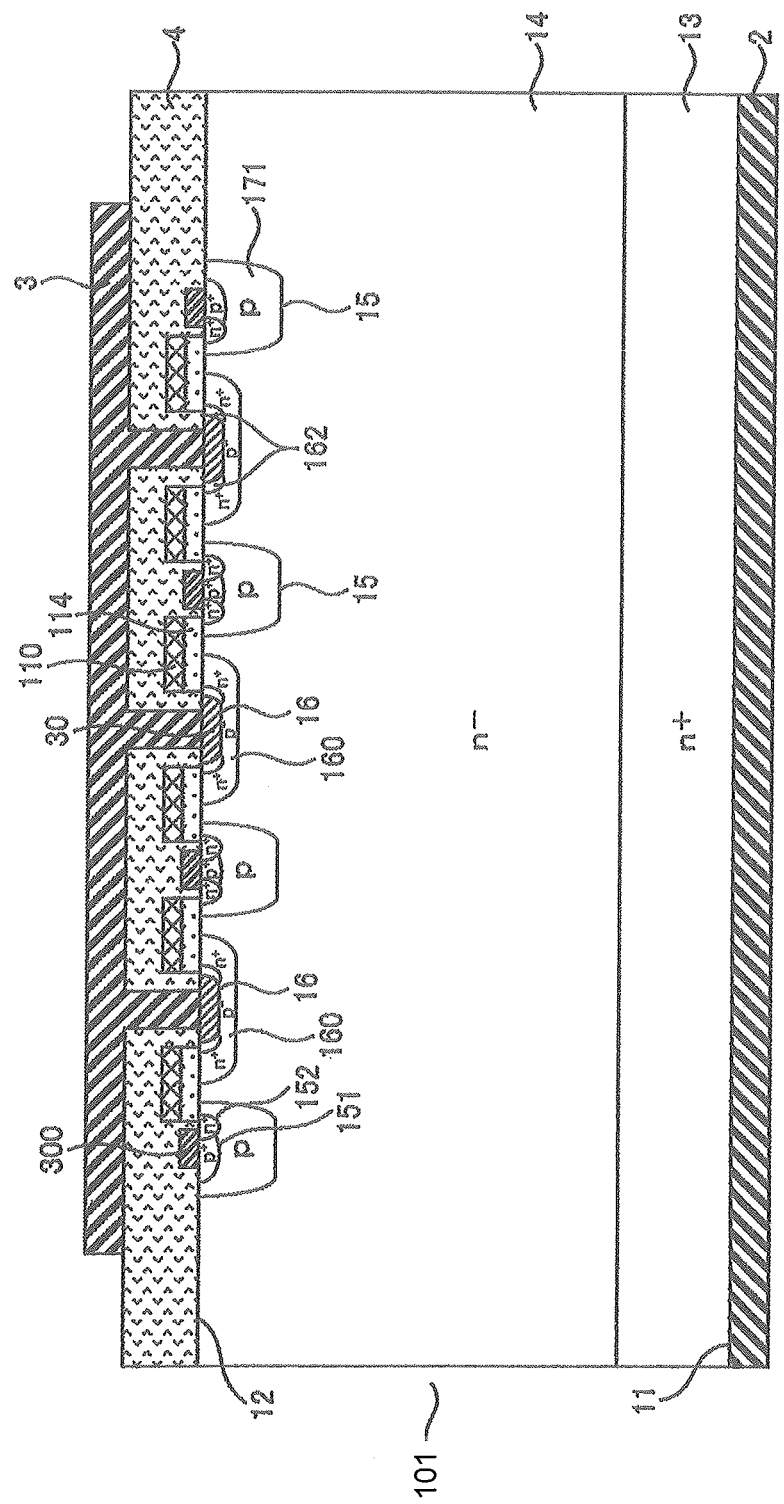
FIG. 17 is a sectional diagram showing yet still another embodiment of the semiconductor device.

Turning to FIG. 17, yet still another embodiment of the invention will be described in which an n⁺ layer 162 is provided for the Schottky electrode 30 at its end confronting the insulated gate 110. By providing the n⁺ layer 162, plus potential can be applied onto the gate electrode and with the p⁻ layer 171 inverted, electrons can easily pass through the Schottky junction 16 and low ohmic connection through the n-inverted p layer 160 and the n⁺ layer 162 can be obtained. As a result, the forward voltage can further be lowered to advantage.

Figure 18:
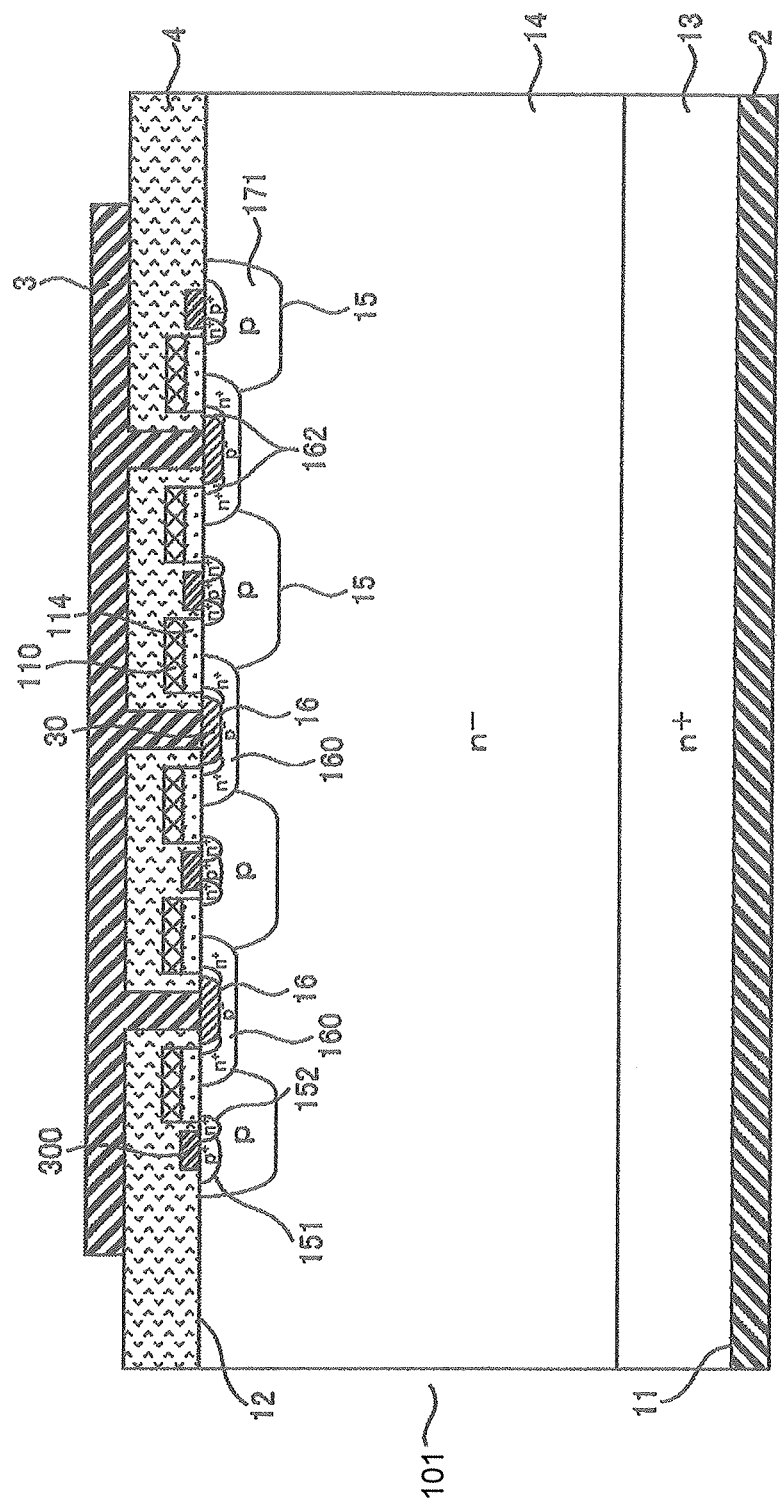
FIG. 18 is a sectional diagram showing still another modified embodiment of the semiconductor device.

The embodiment of FIG. 17 can be modified as shown in FIG. 18. It is not always necessary that separation between the p⁻ layer 160 and the p layer 171 by means of the n⁻ layer 14 be done and even when they are in contact with each other as shown in FIG. 18, effects similar to those in FIG. 17 are found obtained.

According to the present invention, by providing the conventionally unavailable device for switching over from the pn diode to Schottky diode or vice-versa in the forward and backward states of the flywheel diode of the semiconductor device or the power converter such as an inverter, current can be passed through the pn diode having a small forward voltage when the forward current flows whereas backward recovery can be done through the Schottky diode having a small backward recovery current during backward recovery so that the forward voltage of the flywheel diode can be decreased and its backward recovery loss can be reduced, making it possible to provide the semiconductor device and power converter as well in which the loss can be reduced drastically. Further, with the backward recovery current decreased, its current change rate di/dt can be reduced to a great extent and hence bounce voltage generated cooperatively with a parasitic inductance can be reduced remarkably. Consequently, the semiconductor device and the power converter such as an inverter device can be rendered highly efficient and lowered in noise, thus promoting the widespread use of the power converter, energy saving and renewable energy technologies toward the Low-carbon siciety.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
a switching power device; and
a flywheel diode connected to said switching power device in series, said flywheel diode including a region having a Schottky junction to operate as a Schottky diode and a region having a pn junction to operate as a pn diode,
wherein said flywheel diode comprises a gate controlled diode which includes an insulated gate and which is configured to switch alternately between the region having the Schottky junction to operate as a Schottky diode and the region having the pn junction to operate as a pn switch, and
wherein said insulated gate of said flywheel diode is configured to receive a control signal ($V_{GA}$) which is synchronized with a gate signal ($V_{GE}$) supplied to said switching power device, and said flywheel diode is configured to be controlled by said insulated gate receiving said control signal ($V_{GA}$) such that before said switching power device is switched over from off to on by said gate signal ($V_{GE}$), a first operation mode in which a current flows primarily through at least said pn diode forwardly is changed to a second operation mode in which the current flows mainly through the Schottky diode to reduce backward recovery current in said semiconductor device when the switching power device is turned on.

2. The semiconductor device according to claim 1, wherein said insulated gate of flywheel diode is further configured to be controlled by said insulated gate receiving said control signal ($V_{GA}$) such that before said switching power device is switched over from on to off by said gate signal ($V_{GE}$), said flywheel diode is changed from the second operation mode to the first operation mode so that at least said pn diode is allowed to primarily pass the current forwardly to reduce forward voltage drop in the semiconductor device when the switching power device is turned off.

3. The semiconductor device according to claim 1, wherein said flywheel diode includes:
a semiconductor substrate having a pair of surfaces;
a first semiconductor layer having a first conductivity type (n) and exposed to one surface of said semiconductor substrate;
a second semiconductor layer having a second conductivity type (p), exposed to the other surface of said semiconductor substrate and contacting said first semiconductor layer, wherein:
said first semiconductor layer and said second semiconductor layer form said pn junction;

a Schottky metal provided on the other surface of said semiconductor substrate and contacting said first semiconductor layer forms said Schottky junction;

said insulated gate bridges said second semiconductor layer of second conductivity type and said Schottky metal;

an anode electrode electrically connects to said Schottky metal through low resistance; and a cathode electrode contacts said first semiconductor layer on the one surface through low resistance.

4. The semiconductor device according to claim 3, wherein by applying to said gate electrode of insulated gate a voltage negative in relation to said anode electrode, said Schottky electrode and said second semiconductor layer are electrically connected to each other.

5. The semiconductor device according to claim 1 wherein said flywheel diode includes:

a semiconductor substrate having a pair of surfaces;

a first semiconductor layer having a first conductivity type (n) and exposed to one surface of said semiconductor substrate;

a second semiconductor layer having a second conductivity type (p), exposed to the other surface of said semiconductor substrate and contacting said first semiconductor layer, wherein said first semiconductor layer and said second semiconductor layer form said pn junction;

a Schottky metal provided on the other surface of said semiconductor substrate;

a third semiconductor layer of second conductivity type having a lower impurity concentration than said second semiconductor layer, said third semiconductor layer being provided between said Schottky metal and said first semiconductor layer, and contacting said Schottky metal to form said Schottky junction;

said insulated gate bridging said second semiconductor layer of second conductivity type and said Schottky metal;

an anode electrode electrically connecting to said Schottky metal through low resistance; and a cathode electrode contacting said first semiconductor layer on the one surface through low resistance.

6. The semiconductor device according to claim 1, wherein said flywheel diode includes:

a semiconductor substrate having a pair of surfaces;

a first semiconductor layer having a first conductivity type (n) and exposed to one surface of said semiconductor substrate;

second semiconductor layers each having a second conductivity type (p), exposed to the other surface of said semiconductor substrate and contacting said first semiconductor layer;

Schottky metals provided on the other surface of said semiconductor substrate and contacting said first semiconductor layer to form Schottky junctions;

fourth semiconductor layers of second conductivity type contacting said first semiconductor layer and formed on the both sides of said Schottky metal opposing said second semiconductor layers;

insulated gates each bridging at least said fourth semiconductor layer and said second semiconductor layer;

an anode electrode electrically connecting to each of said Schottky metals through low resistance; and a cathode electrode contacting said first semiconductor layer on the one surface through low resistance.

7. The semiconductor device according to claim 6, further comprising:

a fifth semiconductor layer of second conductivity type having a lower impurity concentration than said second semiconductor layer, said fifth semiconductor layer being provided between said Schottky metal and said first semiconductor layer.

8. The semiconductor device according to claim 6, wherein said fourth semiconductor layer has a smaller band gap than that of the other semiconductor layers.

9. The semiconductor device according to claim 1, wherein said flywheel diode includes:

a semiconductor substrate having a pair of surfaces;

a first semiconductor layer having a first conductivity type and exposed to one surface of said semiconductor substrate;

a second semiconductor layer having a second conductivity type, exposed to the other surface of said semiconductor substrate and contacting said first semiconductor layer;

said first semiconductor layer and said second semiconductor layer form said pn junction;

a sixth semiconductor layer having the first conductivity type and formed in said second semiconductor layer;

means for short-circuiting electrically said sixth semiconductor layer and said second semiconductor layer;

Schottky metals provided on the other surface of said semiconductor substrate and contacting said first semiconductor layer to form Schottky junctions;

an anode electrode electrically connected to said Schottky metals through low resistance; and a cathode electrode contacting said first semiconductor layer on the one surface through low resistance, wherein the insulated gate extends over said Schottky metal, said second semiconductor layer and said sixth semiconductor layer.

10. The semiconductor device and a power converter using it according to claim 9, wherein by applying to said gate electrode of insulated gate a voltage positive in relation to said anode electrode, said Schottky metal and said second semiconductor layer are electrically connected to each other.

11. The semiconductor device according to claim 1 said flywheel diode includes:

a semiconductor substrate having a pair of surfaces;

a first semiconductor layer having a first conductivity type and exposed to one surface of said semiconductor substrate;

a second semiconductor layer having a second conductivity type, exposed to the other surface of said semiconductor substrate and contacting said first semiconductor layer;

said first semiconductor layer and said second semiconductor layer form said pn junction;

a sixth semiconductor layer having the first conductivity type and formed in said second semiconductor layer;

means for short-circuiting electrically said sixth semiconductor layer and said second semiconductor layer;

a Schottky metal provided on the other surface of said semiconductor substrate;

a third semiconductor layer of second conductivity type having a lower impurity concentration than said second semiconductor layer, said third semiconductor layer being provided between said Schottky metal and said first semiconductor layer, and contacting said Schottky metal to form said Schottky junction;

an anode electrode electrically connected to said Schottky metal through low resistance; and a cathode electrode contacting said first semiconductor layer on the one surface through low resistance, wherein the insulated gate extends over said Schottky metal, said second semiconductor layer and said sixth semiconductor layer.

12. The semiconductor device according to claim 1, wherein said flywheel diode includes:

a semiconductor substrate having a pair of surfaces;

a first semiconductor layer having a first conductivity type and exposed to one surface of said semiconductor substrate;

second semiconductor layers having a second conductivity type, exposed to the other surface of said semiconductor substrate and contacting said first semiconductor layer;

a sixth semiconductor layer having the first conductivity type and formed in said second semiconductor layer;

means for short-circuiting electrically said sixth semiconductor layer and said second semiconductor layer;

Schottky metals provided on the other surface of said semiconductor substrate and contacting said first semiconductor layer to form Schottky junctions;

a third semiconductor layer of the second conductivity type provided between said Schottky metal and said first semiconductor layer and having a lower impurity concentration than said second semiconductor layer;

a seventh semiconductor layer of first conductivity type formed between said third semiconductor layer and said Schottky metal;

insulated gates each extending over at least said seventh semiconductor layer, said third semiconductor layer, said first semiconductor layer, said second semiconductor layer and said sixth semiconductor layer on the other surface;

an anode electrode electrically connected to said Schottky metals through low resistance; and a cathode electrode contacting said first semiconductor layer on the one surface through low resistance.

13. The semiconductor device according to claim 12, wherein said third semiconductor layer makes contact to said second semiconductor layer.

14. The semiconductor device according to claim 12, wherein said seventh semiconductor layer has a smaller band gap than that of the other semiconductor layers.

15. A power converter comprising:

the semiconductor device according to claim 1, wherein said switching power device is an Insulated Gate Bipolar Transistor.

* * * * *